United States Patent
Kim et al.

(10) Patent No.: US 9,118,176 B2
(45) Date of Patent: Aug. 25, 2015

(54) RADIO FREQUENCY INPUT CIRCUIT WITH ESD PROTECTION FUNCTION

(71) Applicant: SAMSUNG ELECTRO-MECHANICS CO., LTD., Suwon, Gyunggi-do (KR)

(72) Inventors: Youn Suk Kim, Gyunggi-do (KR); Myeong Woo Han, Gyunggi-do (KR); Jun Goo Won, Gyunggi-do (KR); Shinichi Iizuka, Gyunggi-do (KR); Young Jean Song, Gyunggi-do (KR); Ki Joong Kim, Gyunggi-do (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 262 days.

(21) Appl. No.: 13/764,555

(22) Filed: Feb. 11, 2013

(65) Prior Publication Data

US 2014/0146425 A1    May 29, 2014

(30) Foreign Application Priority Data

Nov. 26, 2012   (KR) ........................ 10-2012-0134754

(51) Int. Cl.
   *H02H 9/00*   (2006.01)
   *H02H 9/04*   (2006.01)

(52) U.S. Cl.
   CPC .................................... *H02H 9/044* (2013.01)

(58) Field of Classification Search
   CPC ................................................. H01L 27/0266
   USPC ............................................................. 361/56
   See application file for complete search history.

(56) References Cited

U.S. PATENT DOCUMENTS

| 6,433,985 B1* | 8/2002 | Voldman et al. ............... 361/113 |
| 8,060,019 B2* | 11/2011 | Ginsburg et al. ............... 361/56 |
| 2009/0243755 A1 | 10/2009 | Onodera |

FOREIGN PATENT DOCUMENTS

| JP | 09-018310 A | 1/1997 |
| JP | 2005-191652 A | 7/2005 |
| KR | 10-2002-0027053 A | 4/2002 |
| KR | 2009-0103826 A | 10/2009 |

OTHER PUBLICATIONS

Notice of Office Action Korean Patent Application No. 10-2012-0134754 dated Dec. 20, 2013 with English translation.

* cited by examiner

*Primary Examiner* — Stephen W Jackson
(74) *Attorney, Agent, or Firm* — NSIP Law (57) ABSTRACT

There is provided a radio frequency input circuit including a first direct current blocking unit provided between an input terminal and an input circuit unit and blocking a direct current voltage introduced through the input terminal, a first ESD protection circuit unit provided in parallel with the first direct current blocking unit and forming a bypass path according to an ESD voltage introduced through the input terminal, and a ground circuit unit provided between a first connection node between the first direct current blocking unit and the input circuit unit, and a ground, and forming a ground path according to the ESD voltage.

17 Claims, 6 Drawing Sheets

RADIO FREQUENCY INPUT CIRCUIT WITH ESD PROTECTION FUNCTION

CROSS-REFERENCE TO RELATED APPLICATIONS

This application claims the priority of Korean Patent Application No. 10-2012-0134754 filed on Nov. 26, 2012, in the Korean Intellectual Property Office, the disclosure of which is incorporated herein by reference.

BACKGROUND OF THE INVENTION

1. Field of the Invention

The present invention relates to a radio frequency input circuit with an electrostatic discharge (ESD) protection function, for use in telecommunications devices.

2. Description of the Related Art

In general, cases in which an electrostatic discharge (ESD) having a high electric potential is instantaneously introduced into a portable telecommunications device (hereinafter, referred to as telecommunications devices) such as a smart phone through input terminals as users frequently contact portable devices, and thus, portable devices need to have an ESD protection function.

In existing telecommunications devices, a radio frequency input circuit includes an ESD protection circuit provided between a connection node between an input terminal and a DC blocking capacitor, and a ground.

In a case in which an ESD voltage is input through the input terminal, the ESD protection circuit forms a discharge path for the ESD voltage to allow the ESD voltage to flow to the ground. This operation may protect the DC blocking capacitor from the ESD voltage.

In this regard, the ESD protection circuit includes a forward diode circuit unit including a plurality of diodes connected to each other in series in a forward direction to form an ESD protection path for a positive (+) ESD voltage and a backward diode circuit unit including a plurality of diodes connected to each other in series in a backward direction to form an ESD protection path for a negative H) ESD voltage.

However, there may be a problem such as increasing a size of an ESD protection circuit according to the related art, since the higher the voltage level of an input signal becomes, the more the number of the diodes need to be connected to each other in series in such a manner that the ESD protection circuit does not operate at a voltage of the input signal but only operates at the ESD voltage.

Also, parasitic capacitance may occur to correspond to the number of diodes used for the ESD protection circuit, and thus, impedance mismatching is likely to occur, and an additional protection circuit is problematically necessary for compensating for the impedance mismatching.

The Related Art document below relates to a noise filter and a noise filter embedded amplifier circuit and does not disclose the matter for improving a defect in that the higher the voltage level of the input signal becomes, the more the size thereof increases.

RELATED ART DOCUMENT

Korean Patent Laid-Open Publication No. 10-2009-0103826

SUMMARY OF THE INVENTION

An aspect of the present invention provides a radio frequency input circuit with an electrostatic discharge (ESD) protection function that can be implemented in a previously set size, irrespective of a magnitude of an input signal.

According to an aspect of the present invention, there is provided a radio frequency input circuit including: a first direct current blocking unit provided between an input terminal and an input circuit unit and blocking a direct current voltage introduced through the input terminal; a first ESD protection circuit unit provided in parallel with the first direct current blocking unit and forming a bypass path according to an ESD voltage introduced through the input terminal; and a ground circuit unit provided between a first connection node between the first direct current blocking unit and the input circuit unit, and a ground, and forming a ground path according to the ESD voltage.

According to another aspect of the present invention, there is provided a radio frequency input circuit including: a first direct current blocking unit provided between an input terminal and an input circuit unit and blocking a direct current voltage introduced through the input terminal; a first ESD protection circuit unit provided in parallel with the first direct current blocking unit and forming a bypass path according to an ESD voltage introduced through the input terminal; a ground circuit unit provided between a first connection node between the first direct current blocking unit and the input circuit unit, and a ground, and forming a ground path according to the ESD voltage; and a second ESD protection circuit unit connected between a second connection node between the input circuit unit and an output terminal, and the ground, and forming a ground path according to an ESD voltage provided through the output terminal.

The first direct current blocking unit may include a first capacitor having one end connected to the input terminal and another end connected to the first connection node.

The first ESD protection circuit unit may include: a first bypass path unit forming a first bypass path according to a positive (+) ESD voltage through the input terminal; and a second bypass path unit forming a second bypass path according to a negative (−) ESD voltage through the input terminal.

The first bypass path unit may include at least one or more diodes connected to each other in series in a forward direction between the input terminal and the first connection node.

The second bypass path unit may include at least one or more diodes connected to each other in series in a backward direction between the input terminal and the first connection node.

The ground circuit unit may include a first inductor having one end connected to the first connection node and another end connected to the ground.

The radio frequency input circuit may further include: a second direct current blocking unit provided between the first connection node and the input circuit unit and blocking a direct current voltage introduced through the first ESD protection circuit unit.

The second ESD protection circuit unit may include: a third bypass path unit forming a third bypass path according to a positive (+) ESD voltage through the output terminal; and a fourth bypass path unit forming a fourth bypass path according to a negative (−) ESD voltage through the output terminal.

The third bypass path unit may include at least one or diodes connected to each other in series in a forward direction between the second connection node and the ground.

The fourth bypass path unit may include at least one or more diodes connected to each other in series in a backward direction between the second connection node and the ground.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

Figure 1:
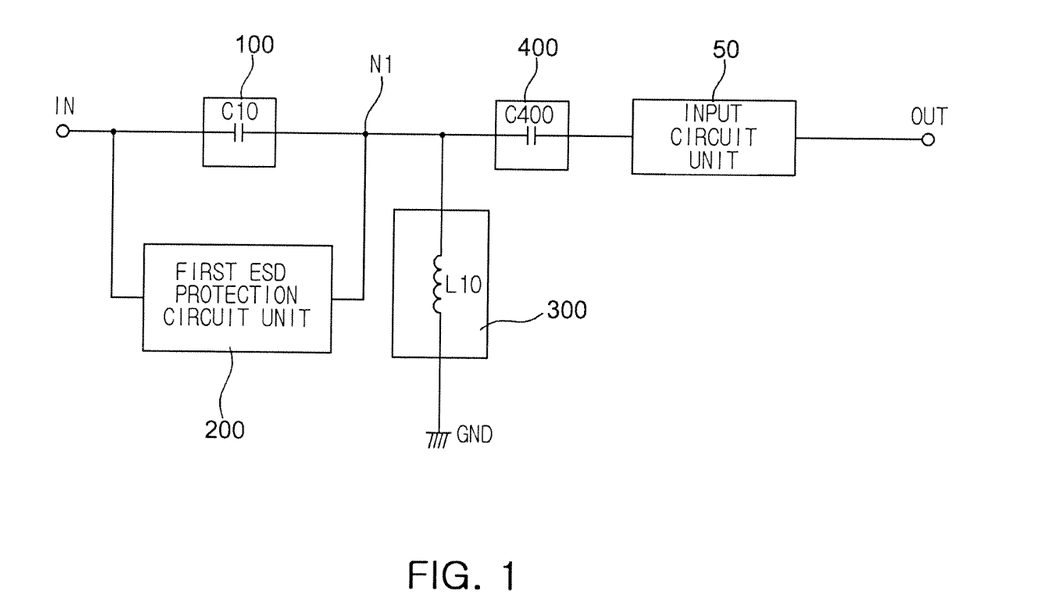
FIG. 1 is a block diagram of a radio frequency input circuit according to an embodiment of the present invention.

FIG. 1 is a block diagram of a radio frequency input circuit according to an embodiment of the present invention.

Referring to FIG. 1, the radio frequency input circuit according to the embodiment of the present invention may include a first direct current blocking unit 100, a first ESD protection circuit unit 200, and a ground circuit unit 300.

Figure 2:
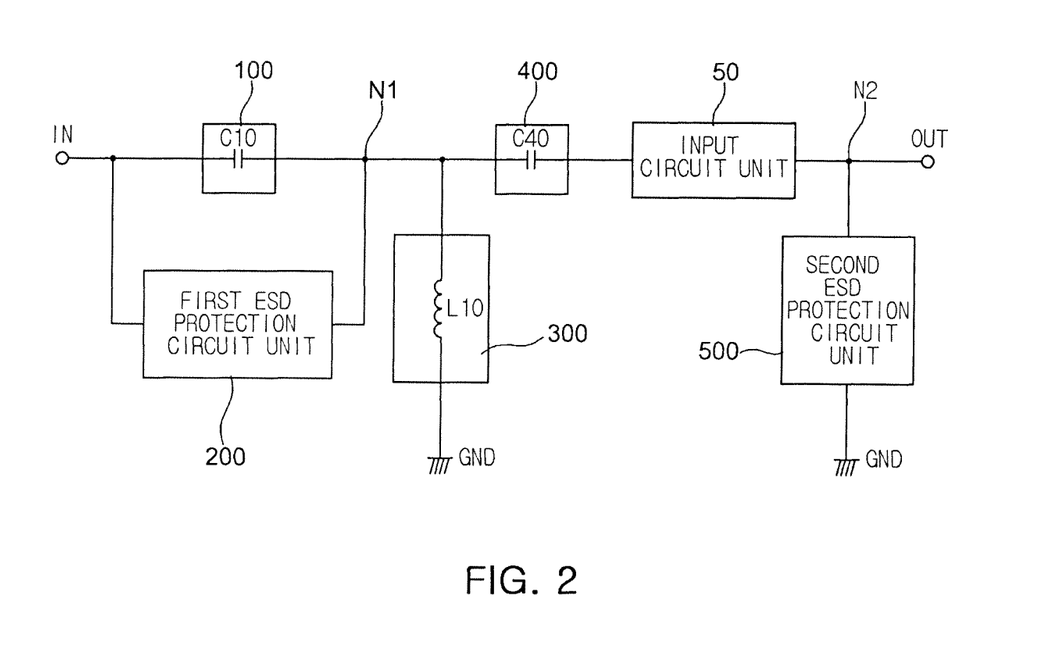
FIG. 2 is a block diagram of a radio frequency input circuit according to another embodiment of the present invention.

FIG. 2 is a block diagram of a radio frequency input circuit according to another embodiment of the present invention.

Referring to FIG. 2, the radio frequency input circuit according to the embodiment of the present invention may further include a second ESD protection circuit unit 500 in addition to the radio frequency input circuit according to the embodiment of the present invention.

Referring to FIGS. 1 and 2, the first direct current blocking unit 100 may be provided between an input terminal IN and an input circuit unit 50 and block a direct current voltage introduced through the input terminal IN. That is, the first direct current blocking unit 100 blocks the direct current voltage and allows an input signal that is an alternating current to pass therethrough.

For example, the first direct current blocking unit 100 may include a first capacitor C10 having one end connected to the input terminal IN and another end connected to a first connection node N1. The first connection node N1 is a node present between the first direct current blocking unit 100 and the input circuit unit 50.

The first ESD protection circuit unit 200 may be provided in parallel to the first direct current blocking unit 100 to form a bypass path by an ESD voltage introduced through the input terminal IN.

For example, when a peak versus peak voltage of the input signal is 20V, the ESD voltage is much higher than a voltage of the input signal, and thus may be a voltage in the range of, for example, 100V~1 kV.

The ground circuit unit 300 may be provided between the first connection node N1 and a ground GND to form a ground path by the ESD voltage. For example, the ground circuit unit 300 may include a first inductor L10 having one end connected to the first connection node N1 and another end connected to the ground GND.

Meanwhile, the radio frequency input circuit according to the embodiments of the present invention may further include a second direct current blocking unit 400.

The second direct current blocking unit 400 may be disposed between the first connection node N1 and the input circuit unit 50 to block a direct current voltage introduced through the first ESD protection circuit unit 200. For example, the second direct current blocking unit 400 may include a second capacitor C40 having one end connected to the first connection node N1 and another end connected to the input circuit unit 50.

Accordingly, when the ESD voltage is input through the input terminal IN, the first ESD protection circuit unit 200 forms a bypass path of the first direct current blocking unit 100 so that the ESD voltage does not pass through the first direct current blocking unit 100, but is applied to the first connection node N1 through the bypass path of the first ESD protection circuit unit 200, and then, is not applied to the input circuit unit 50 by the second direct current blocking unit 400, but flows through the ground GND through the ground circuit unit 300.

Accordingly, although a withstand voltage of the first direct current blocking unit 100 is set to be lower than the ESD voltage, the first direct current blocking unit 100 may be prevented from a functional loss or being damaged by the ESD voltage.

Referring to FIG. 2, the second ESD protection circuit unit 500 may be connected between a second connection node N2 between the input circuit unit 50 and an output terminal OUT, and the ground GND, to form a ground path by the ESD voltage provided through the output terminal OUT.

For example, in the case that the ESD voltage is provided through the output terminal OUT, the ESD voltage is provided through the ground GND through the second ESD protection circuit unit 500. Accordingly, the input circuit unit 50 may be protected from the ESD voltage provided through the output terminal OUT by the second ESD protection circuit unit 500.

Figure 3:
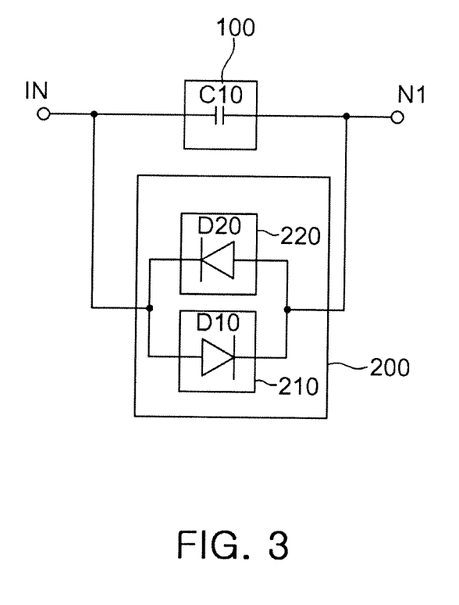
FIGS. 3 and 4 are views illustrating a first ESD protection circuit unit of FIG. 1 by way of example.
Figure 4:
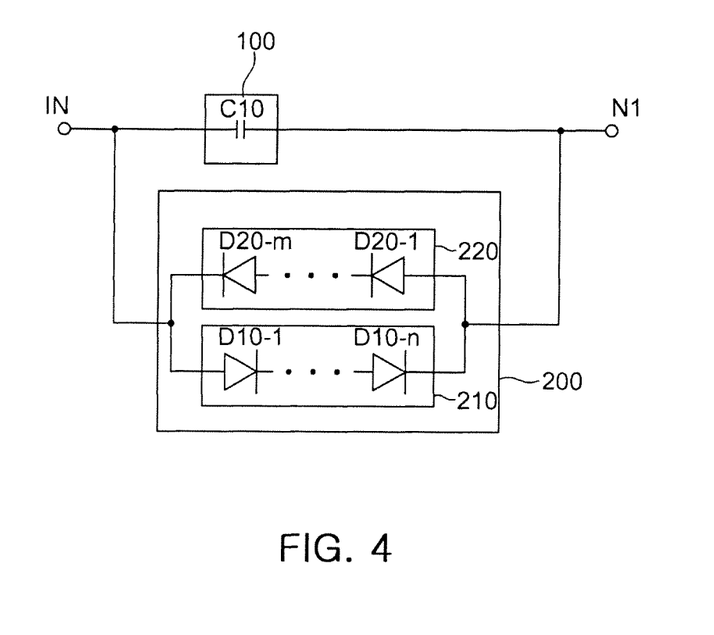

FIGS. 3 and 4 are views illustrating the first ESD protection circuit unit 200 of FIG. 1 by way of example.

Referring to FIGS. 3 and 4, the first ESD protection circuit unit 200 may include a first bypass path unit 210 that forms a first bypass path by a positive (+) ESD voltage through the input terminal IN and a second bypass path unit 220 that forms a second bypass path by a negative (−) ESD voltage through the input terminal IN.

The first bypass path unit 210 may include at least one diode D10 or more diodes connected to each other in series in a forward direction between the input terminal IN and the first connection node N1. The second bypass path unit 220 may include at least one diode D20 or more diodes connected to each other in series in a backward direction between the input terminal IN and the first connection node N1.

Referring to FIG. 3, the first bypass path unit 210 may include the at least one diode D10 connected in series in the forward direction between the input terminal IN and the first connection node N1.

The second bypass path unit 220 may include the at least one diode D20 connected in series in the backward direction between the input terminal IN and the first connection node N1.

Referring to FIG. 4, the first bypass path unit 210 may include a plurality of diodes D10-1~D10-$n$ connected to one another in series in the forward direction between the input terminal IN and the first connection node N1. The second bypass path unit 220 may include a plurality of diodes D20-1~D20-m connected to one another in series in the backward direction between the input terminal IN and the first connection node N1.

In this regard, n and m are natural numbers equal to or greater than 1, may be the same number or different numbers, and may be determined in accordance with characteristics of an ESD voltage that may be introduced through an input terminal of a system according to the embodiment of the present invention.

For example, to perform a protection function with respect to an ESD voltage equal to or higher than +15V and an ESD voltage equal to or lower than −10V, in a case in which a conduction voltage of one diode is 1.2V, the first bypass path unit 210 may include 12 diodes (1.2V*12=14.4V). In the case in which a conduction voltage of one diode is 1.2V, the second bypass path unit 220 may include 8 diodes (1.2V*8=9.6V).

Meanwhile, in order to prevent the first ESD protection circuit unit 200 from generating a leakage current, a voltage difference between both ends of the first capacitor C10 of the first direct current blocking unit 100 needs to be lower than a conduction voltage of diodes of the first ESD protection circuit unit 200. To meet such a condition, the number of diodes required in the first EST protection circuit unit 200 will hereinafter be described.

For example, it is assumed that an input impedance of the input circuit unit 50 is 50 ohm, a frequency of an input signal is 2 Ghz, the first capacitor C10 of the first direct current blocking unit 100 is 10 pF, a peak voltage of the input signal is DC 1V+AC 1V peak, and the conduction voltage of diodes of the first ESD protection circuit unit 200 is 1.2V.

The impedance of the first capacitor C10 of the first direct current blocking unit 100 is defined according to equation 1 below.

$$Z(C10) = \frac{1}{j2\omega * C10} \quad \text{[Equation 1]}$$
$$= \frac{1}{j2(\pi * 2 \text{ Ghz}) * 10 \text{ pF}}$$
$$= -8.0\Omega$$

In this regard, when f denotes a frequency, ω denotes an angular frequency (=2 πf).

A peak voltage Vb-peak of a voltage Vb applied to the input circuit unit 50 may be calculated as a voltage applied to an input impedance of the input circuit unit 50 with respect to the entire impedance of the impedance of the first capacitor C10 and the input impedance of the input circuit unit 50 and is defined according to equation 2 below.

$$Vb-\text{peak} = \frac{50}{8+50} = 0.86 \text{ V} \quad \text{[Equation 2]}$$

In this regard, since a peak voltage Vin-peak of the input signal is 2V, a voltage of the both ends of the first capacitor C10 of the first direction current blocking unit 100 is defined according to equation 3 below.

$$C10 \text{ 의양단전압} = Vin\text{-peak} - Vb\text{-peak} = 2V - 0.86V = 1.14V \quad \text{[Equation 3]}$$

In Equation 3 above, the voltage of the both ends of the first capacitor C10 is 1.14V that is smaller than 1.2V that is the conduction voltage of diodes of the first ESD protection circuit unit 200, and thus the first ESD protection circuit unit 200 does not generate the leakage current, even in the case in which a single diode is used.

Unlike the above-described example, in a case in which a DC voltage of the input signal is relatively high or capacitance of the first capacitor C10 is relatively small, the number of diodes needs to be increased in order to prevent the first ESD protection circuit unit 200 from generating the leakage current.

Figure 5:
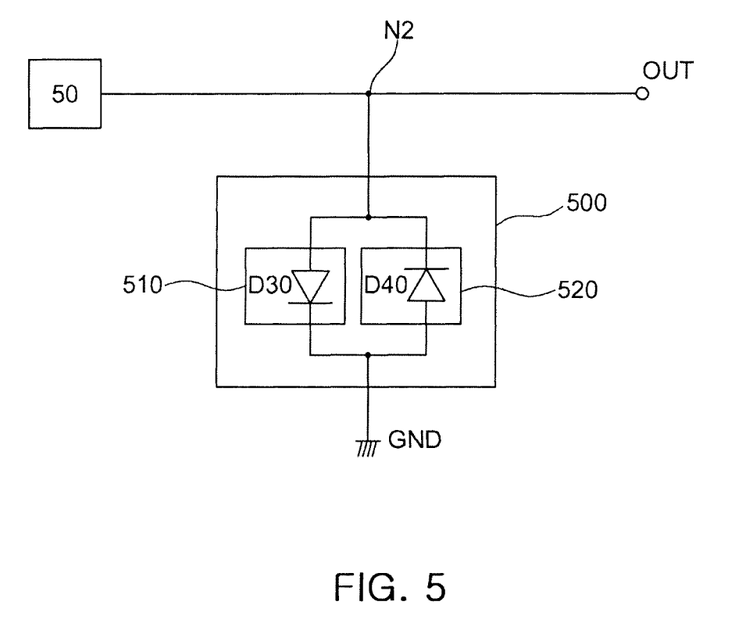
FIGS. 5 and 6 are views illustrating a second ESD protection circuit unit of FIG. 2 by way of example.
Figure 6:
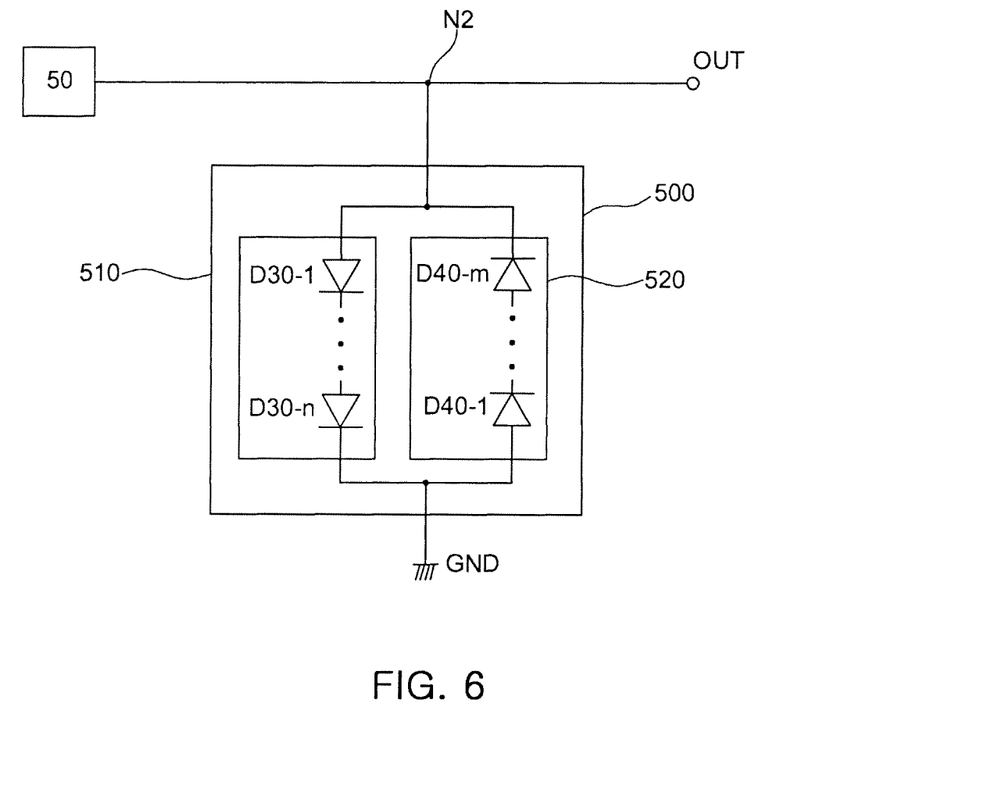

FIGS. 5 and 6 are views illustrating a second ESD protection circuit unit of FIG. 2 by way of example.

Referring to FIGS. 5 and 6, the second ESD protection circuit unit 500 may include a third bypass path unit 510 that forms a third bypass path by a positive (+) ESD voltage through the output terminal OUT and a fourth bypass path unit 520 that forms a fourth bypass path by a negative (−) ESD voltage through the output terminal OUT.

The third bypass path unit 510 may include at least one diode D30 connected in series in a forward direction between the second connection node N2 and the ground GND. The fourth bypass path unit 520 may include at least one diode D40 connected in series in a backward direction between the second connection node N2 and the ground GND.

Referring to FIG. 5, the third bypass path unit 510 may include the at least one diode D30 connected in series in the forward direction between the second connection node N2 and the ground GND. The fourth bypass path unit 520 may include the at least one diode D40 connected in series in the backward direction between the second connection node N2 and the ground GND.

Referring to FIG. 6, the third bypass path unit 510 may include a plurality of diodes D30-1~D30-n connected to one another in series in the forward direction between the second connection node N2 and the ground GND. The fourth bypass path unit 520 may include a plurality of diodes D40-1~D40-m connected to one another in series in the backward direction between the second connection node N2 and the ground GND.

In this regard, n and m, natural numbers equal to or greater than 1, may be the same number or different numbers, and may be determined in accordance with characteristics of an ESD voltage that may be provided through an output terminal of the input circuit unit of a system to which the present invention is applied.

For example, to perform a protection function with respect to an ESD voltage equal to or higher than +16V and an ESD voltage equal to or lower than −11V, in a case in which a conduction voltage of one diode is 1.2V, the third bypass path unit 510 may include 13 diodes (1.2V*13=15.6V). In the case in which a conduction voltage of one diode is 1.2V, the fourth bypass path unit 520 may include 9 diodes (1.2V*9=10.8V).

As set forth above, according to the embodiments of the invention, an ESD protection circuit is connected in parallel to a direct current blocking capacitor, and thus, irrespective of a magnitude of an input signal, a size thereof may be reduced and a parasitic capacitance may be reduced.

While the present invention has been shown and described in connection with the embodiments, it will be apparent to those skilled in the art that modifications and variations can be made without departing from the spirit and scope of the invention as defined by the appended claims.

What is claimed is:

1. A radio frequency input circuit comprising:
    a first direct current blocking unit provided between an input terminal and an input circuit unit and blocking a direct current voltage introduced through the input terminal;

a first ESD protection circuit unit provided in parallel with the first direct current blocking unit and forming a bypass path according to an ESD voltage introduced through the input terminal; and a ground circuit unit provided between a first connection node between the first direct current blocking unit and the input circuit unit, and a ground, and forming a ground path according to the ESD voltage.

2. The radio frequency input circuit of claim 1, wherein the first direct current blocking unit includes a first capacitor having one end connected to the input terminal and another end connected to the first connection node.

3. The radio frequency input circuit of claim 1, wherein the first ESD protection circuit unit includes:
a first bypass path unit forming a first bypass path according to a positive (+) ESD voltage through the input terminal; and
a second bypass path unit forming a second bypass path according to a negative (−) ESD voltage through the input terminal.

4. The radio frequency input circuit of claim 3, wherein the first bypass path unit includes at least one or more diodes connected to each other in series in a forward direction between the input terminal and the first connection node.

5. The radio frequency input circuit of claim 3, wherein the second bypass path unit includes at least one or more diodes connected to each other in series in a backward direction between the input terminal and the first connection node.

6. The radio frequency input circuit of claim 3, wherein the ground circuit unit includes a first inductor having one end connected to the first connection node and another end connected to the ground.

7. The radio frequency input circuit of claim 3, further comprising a second direct current blocking unit provided between the first connection node and the input circuit unit and blocking a direct current voltage introduced through the first ESD protection circuit unit.

8. A radio frequency input circuit comprising:
a first direct current blocking unit provided between an input terminal and an input circuit unit and blocking a direct current voltage introduced through the input terminal;
a first ESD protection circuit unit provided in parallel with the first direct current blocking unit and forming a bypass path according to an ESD voltage introduced through the input terminal;
a ground circuit unit provided between a first connection node between the first direct current blocking unit and the input circuit unit, and a ground, and forming a ground path according to the ESD voltage; and
a second ESD protection circuit unit connected between a second connection node between the input circuit unit and an output terminal, and the ground, and forming a ground path according to an ESD voltage provided through the output terminal.

9. The radio frequency input circuit of claim 8, wherein the first direct current blocking unit includes a first capacitor having one end connected to the input terminal and another end connected to the first connection node.

10. The radio frequency input circuit of claim 9, wherein the first ESD protection circuit unit includes:
a first bypass path unit forming a first bypass path according to a positive (+) ESD voltage through the input terminal; and
a second bypass path unit forming a second bypass path according to a negative (−) ESD voltage through the input terminal.

11. The radio frequency input circuit of claim 10, wherein the first bypass path unit includes at least one or more diodes connected to each other in series in a forward direction between the input terminal and the first connection node.

12. The radio frequency input circuit of claim 10, wherein the second bypass path unit includes at least one or more diodes connected to each other in series in a backward direction between the input terminal and the first connection node.

13. The radio frequency input circuit of claim 9, wherein the ground circuit unit includes a first inductor having one end connected to the first connection node and another end connected to a ground.

14. The radio frequency input circuit of claim 8, further comprising a second direct current blocking unit provided between the first connection node and the input circuit unit and blocking a direct current voltage introduced through the first ESD protection circuit unit.

15. The radio frequency input circuit of claim 9, wherein the second ESD protection circuit unit includes:
a third bypass path unit forming a third bypass path according to a positive (+) ESD voltage through the output terminal; and
a fourth bypass path unit forming a fourth bypass path according to a negative (−) ESD voltage through the output terminal.

16. The radio frequency input circuit of claim 10, wherein the third bypass path unit includes at least one or more diodes connected to each other in series in a forward direction between the second connection node and the ground.

17. The radio frequency input circuit of claim 10, wherein the fourth bypass path unit includes at least one or more diodes connected to each other in series in a backward direction between the second connection node and the ground.

\* \* \* \* \*